United States Patent
Takahashi

(10) Patent No.: US 7,164,447 B2
(45) Date of Patent: Jan. 16, 2007

(54) SOLID STATE IMAGE PICKUP DEVICE

(75) Inventor: Hidekazu Takahashi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 841 days.

(21) Appl. No.: 10/361,598

(22) Filed: Feb. 11, 2003

(65) Prior Publication Data

US 2003/0160887 A1 Aug. 28, 2003

(30) Foreign Application Priority Data

Feb. 22, 2002 (JP) .............................. 2002-046474
Jan. 28, 2003 (JP) .............................. 2003-019006

(51) Int. Cl.
*H04N 5/232* (2006.01)
*H04N 5/335* (2006.01)
*H04N 5/238* (2006.01)
*G03B 3/10* (2006.01)
*H01L 31/062* (2006.01)
*H01L 31/06* (2006.01)

(52) U.S. Cl. .................... 348/350; 348/294; 348/315; 348/364; 396/100; 257/291; 257/463

(58) Field of Classification Search ............... 348/350; 396/100
See application file for complete search history.

(56) References Cited

U.S. PATENT DOCUMENTS 5,302,997 A * 4/1994 Cocca ........................ 396/233
5,313,246 A * 5/1994 Takagi et al. ................ 396/122
5,777,675 A * 7/1998 Miida et al. ................. 348/350
6,085,039 A * 7/2000 Hamada et al. .............. 396/100
6,194,258 B1 * 2/2001 Wuu ..................... 257/E27.131
6,483,163 B1 * 11/2002 Isogai et al. ................. 257/446
6,973,265 B1 * 12/2005 Takahashi .................... 396/121

FOREIGN PATENT DOCUMENTS

JP 2000-180706 A 6/2000

\* cited by examiner

*Primary Examiner*—David Ometz
*Assistant Examiner*—Nhan Tran
(74) *Attorney, Agent, or Firm*—Fitzpatrick, Cella, Harper & Scinto

(57) ABSTRACT

A solid state image pickup device is provided which can reduce crosstalks between range finding photoelectric conversion elements (AF sensor) and photometry photoelectric conversion elements (AE sensor). The solid state image pickup device has an n-type epitaxial semiconductor region, a p-type first well region formed in the semiconductor region, a p-type second well region formed in the semiconductor region and electrically separated from the first well, an n-type first impurity doped region formed in the first well region and an n-type second impurity doped region formed in the second well, wherein a photometry photoelectric conversion element is formed by using the p-type first well region and n-type first impurity doped region, and a range finding photoelectric element is formed by using the p-type second well region and n-type impurity doped region.

4 Claims, 14 Drawing Sheets

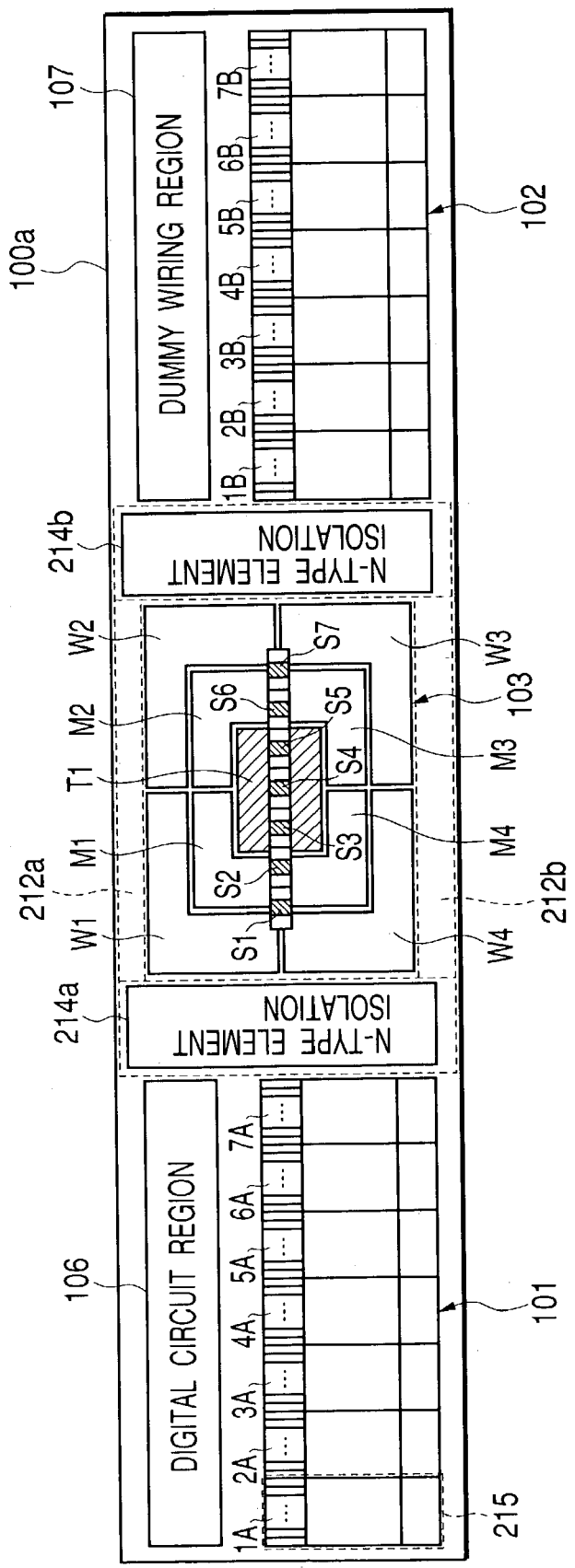

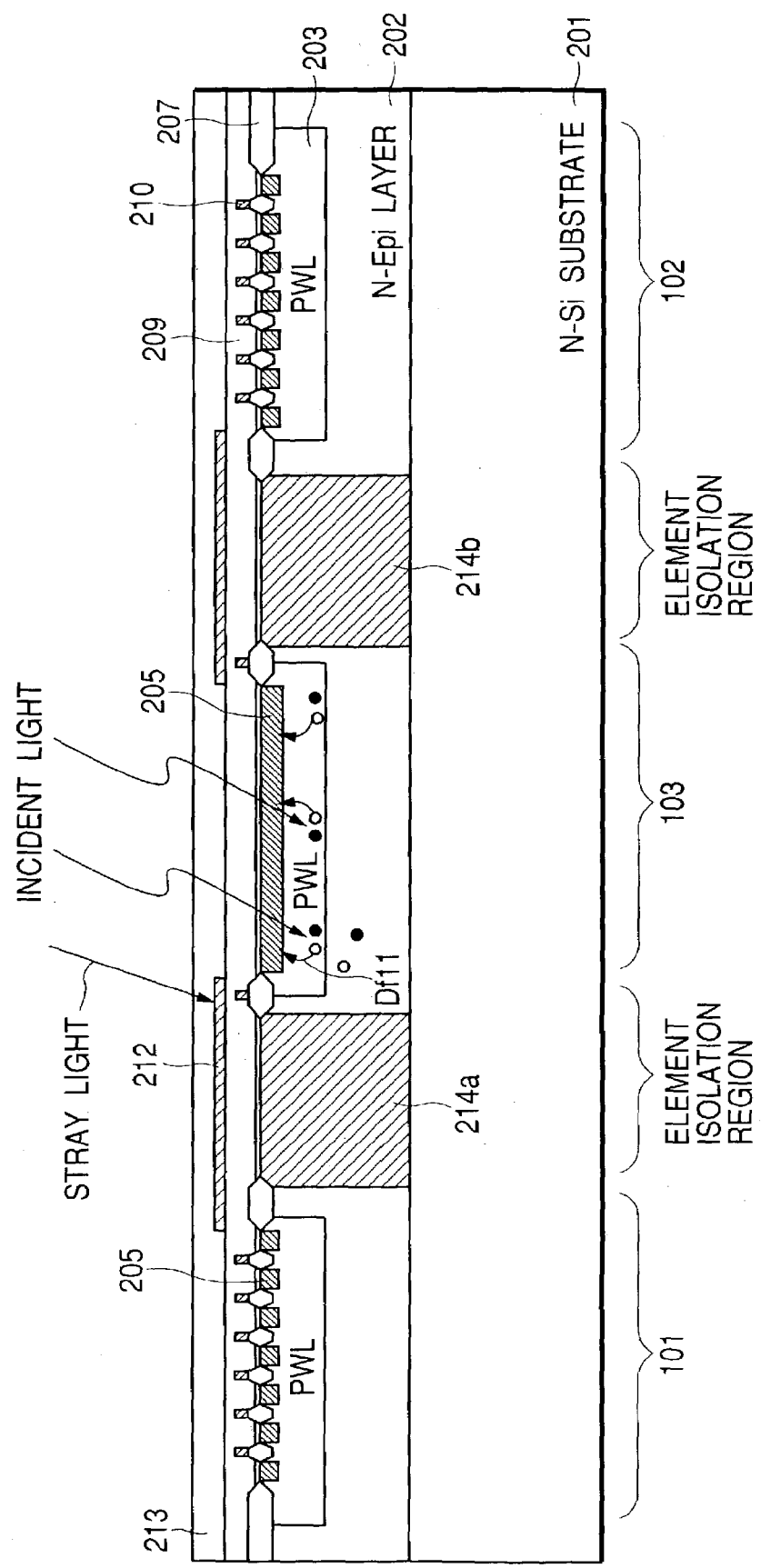

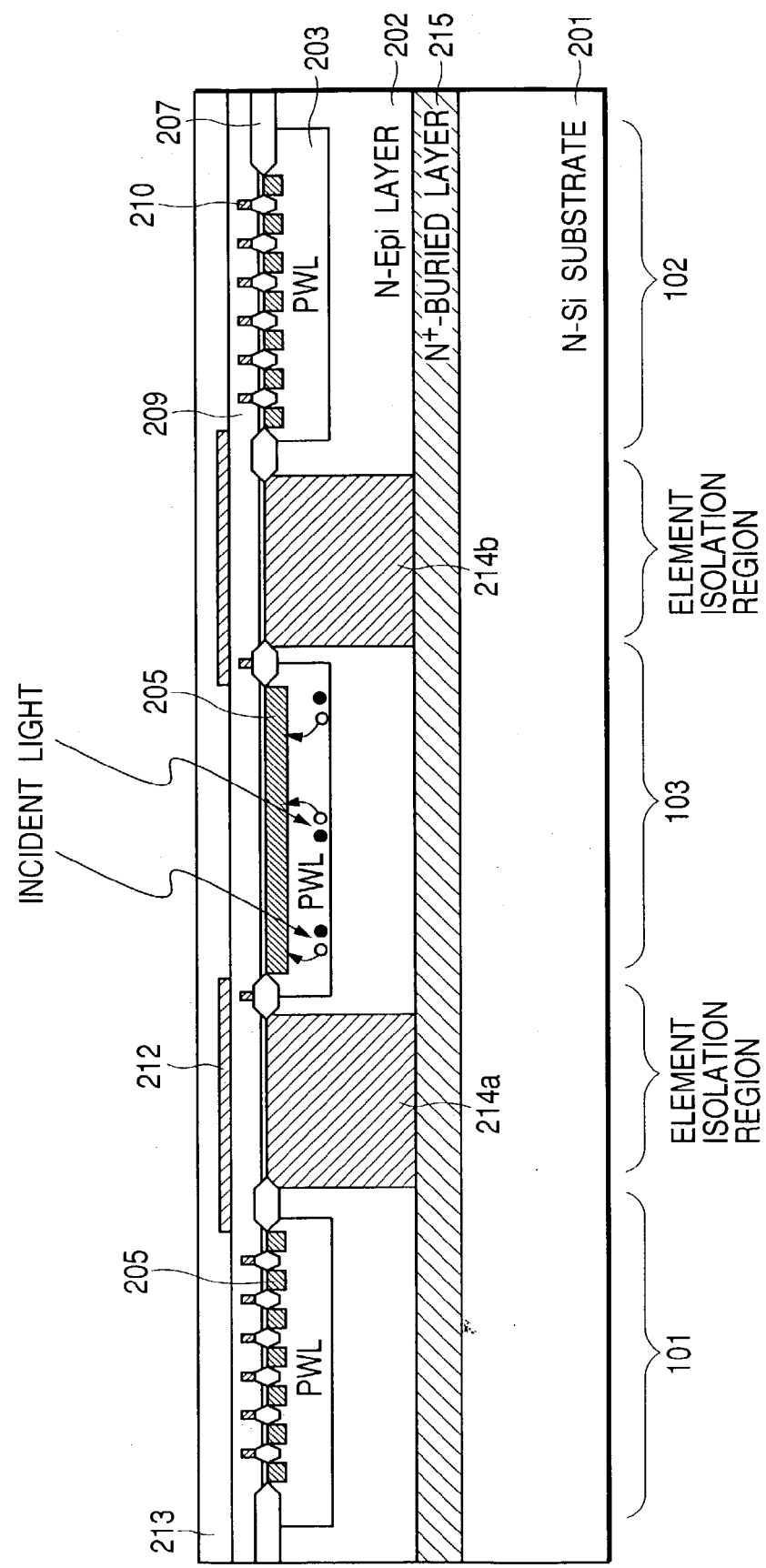

SOLID STATE IMAGE PICKUP DEVICE

BACKGROUND OF THE INVENTION

1. Field of the Invention

The present invention relates to a solid state image pickup device suitable for use as an automatic focussing solid state image pickup device with a photometry function, particularly as a compact camera automatic focussing sensor of a phase difference detection and external photometry type.

2. Related Background Art

A range finding (automatic focussing, AF) sensor with a photometry (automatic exposure, AE) function for a conventional lens-shutter compact camera has been realized as a solid state image pickup device as disclosed, for example, in U.S. Pat. No. 5,302,997. A schematic plan layout of this solid state image pickup device is shown in FIG. 11. Referring to FIG. 11, an AE sensor array 30 is constituted of an AE center segment 32, AE inner segments 34A, 34B, 34C and 34D and AE outer segments 36A, 36B, 36C and 36D. The solid state image pickup device has also AF sensor arrays (linear sensor arrays) 40 and 42 constituted of pixels $44_{1-n}$ and $46_{1-n}$, respectively. The AE sensor array 30 and AF sensor arrays 40 and 42 are formed on a silicon semiconductor substrate 50. The AE region has a height H and a width W. The baseline length is represented by D.

Two AF linear sensor arrays 40 and 42 are used for performing photometry through phase difference detection. An AF sensitivity representative of a range finding precision can be given by:

$$AF\ \text{sensitivity} = D \times f/P$$

where P is a pixel pitch and f is a focal length of an AF lens. A solid state image pickup device having the AF sensitivity of about 5000 is presently available. If a pixel pitch is about 10 µm and a lens focal length is about several mm, then the baseline length is 5 mm to 8 mm. There is, therefore, an invalid region between the linear sensors 40 and 42. However, the AE sensor 30 is formed in this invalid region to effectively use the area of the semiconductor substrate. By integrating the AE sensor 30 and AF sensors 40 and 42 on one chip, a compact and inexpensive camera can be realized.

FIG. 12 is a cross sectional view taken along line 12—12 shown in FIG. 11. For the purposes of simplicity, the number of photodiodes in the AF sensor region and AE sensor regions drawn in FIG. 12 is reduced. Referring to FIG. 12, reference numeral 51 represents an n-type Si substrate, 52 represents an n-type epitaxial layer, 53 represents a p-type well (PWL), 54 represents an n$^+$-type impurity layer, 55 represents a thin oxide film, 56 represents a thick oxide film (locally oxidized silicon) as an element separation region, 57 represents an aluminum (Al) wiring pattern and 58 represents an interlayer insulating film. PWL 53 and n$^+$-type impurity layer 54 constitute a photodiode. As light becomes incident upon the photodiodes in the AE and AF sensor regions, pairs of electrons and holes are generated in the semiconductor through photoelectric conversion. Holes represented by black circles are drained to the ground potential (GND) via PWL 53, whereas electrons represented by white circles are absorbed in the n$^+$-type impurity layers 54 in the AE and AF sensor regions. AE and AF signals are generated by electrons collected in the n$^+$-type impurity layers 54 in the AE and AF sensor regions. However, since the AE and AF sensor regions are formed near each other, large electric and optical crosstalks occur between AE and AF photodiodes in the AE and AF regions.

Problems associated with a conventional solid state image pickup device will be described with reference to FIG. 12. Some of electrons represented by white circles and generated under AE photodiodes in the AE region diffuse into adjacent AF photodiodes in the AF region as indicated by an arrow Df1. Some of electrons represented by white circles and generated under AF photodiodes in the AF region diffuse into adjacent AE photodiodes in the AE region as indicated by an arrow Df2. Stray light indicated by a straight arrow and incident upon photodiodes results in crosstalks. In addition to such crosstalks generated optically, there are crosstalks generated electrically via parasitic capacitance Cp between wiring lines.

If the densities of wiring patterns are irregular in the layout of a solid state image pickup device, there occurs a problem of a lowered precision of a chemical mechanical polishing (CMP) planarization process among CMOS manufacture processes. If the densities of wiring patterns are uniform, the planarized surface is uniform, whereas if the densities of wiring patterns are irregular, the planarized surface is irregular. This is because the polishing speed changes with the presence/absence of wiring patterns under the interlayer insulating film. Irregularity becomes large if there is a region without wiring patterns, among others a region without wiring pattern over a length of about 100 µm. Generally, the positions of AE and AF sensors of an AE/AF solid state image pickup device are determined by an optical system. There is, therefore, the tendency that the densities of wiring patterns become irregular depending upon the chip position and a planarization precision becomes poor.

SUMMARY OF THE INVENTION

It is an object of the invention to realize an AE/AF solid state image pickup device capable of suppressing optical and electric crosstalks.

It is another object of the present invention to improve a precision of a planarizing process during the manufacture of a compact AE/AF solid state image pickup device.

In order to achieve the above objects, a solid state image pickup device according to the invention, comprises: a first semiconductor region of a first conductivity type; a second semiconductor region of a second conductivity type opposite to the first conductivity type, the second semiconductor region being disposed in the first semiconductor region; a third semiconductor region of the second conductivity type formed in the first semiconductor region, the third semiconductor region being electrically isolated from the second semiconductor region; a fourth semiconductor region of the first conductivity type formed in the second semiconductor region; and a fifth semiconductor region formed in the third semiconductor region, wherein a photometry photoelectric conversion element is formed by using the second and fourth semiconductor regions, and a range finding photoelectric conversion element is formed by using the third and fifth semiconductor regions.

According to the invention, crosstalks to be caused by charge diffusion between the photometry photoelectric conversion elements (AE sensor) and range finding photoelectric conversion elements (AF sensor) can be reduced by electrically separating the second semiconductor region such as a well in which the photometry photoelectric conversion elements (AE sensor) are formed from the third semiconductor region such as a well in which the range finding photoelectric conversion elements (AF sensor) are formed. It is therefore possible to improve the precision of photometry and range finding. By disposing a light shielding layer on the separation region, incidence of stray light can be suppressed. Since crosstalks by stray light can be reduced, the precision of photometry and range finding can be improved. By disposing various peripheral circuits in the separation region, a chip size can be reduced.

According to the invention, a dummy wiring region is formed in a region having a low density of wiring lines so that a variation in thicknesses of interlayer insulating films adjusted by a CMP planarization process can be reduced. Since uniform film thicknesses can be obtained, irregular sensitivities of AF sensors can be reduced and the precision of photometry and range finding at a low luminance can be improved.

Uniformity of planarized interlayer insulating films can be improved further by making the optical center of the photometry photoelectric conversion elements (AE sensor) be coincident with the optical center of the range finding photoelectric conversion elements (AF sensor).

BRIEF DESCRIPTION OF THE DRAWING

FIG. 6 is a diagram showing a plan layout of a solid state image pickup device according to a second embodiment of the invention.

FIG. 7 is a cross sectional view of the solid state image pickup device of the second embodiment.

FIG. 8 is a cross sectional view of a solid state image pickup device according to a third embodiment of the invention.

DETAILED DESCRIPTION OF THE PREFERRED EMBODIMENTS

Embodiments of the invention will be described with reference to the accompanying drawings.

(First Embodiment)

Figure 1:
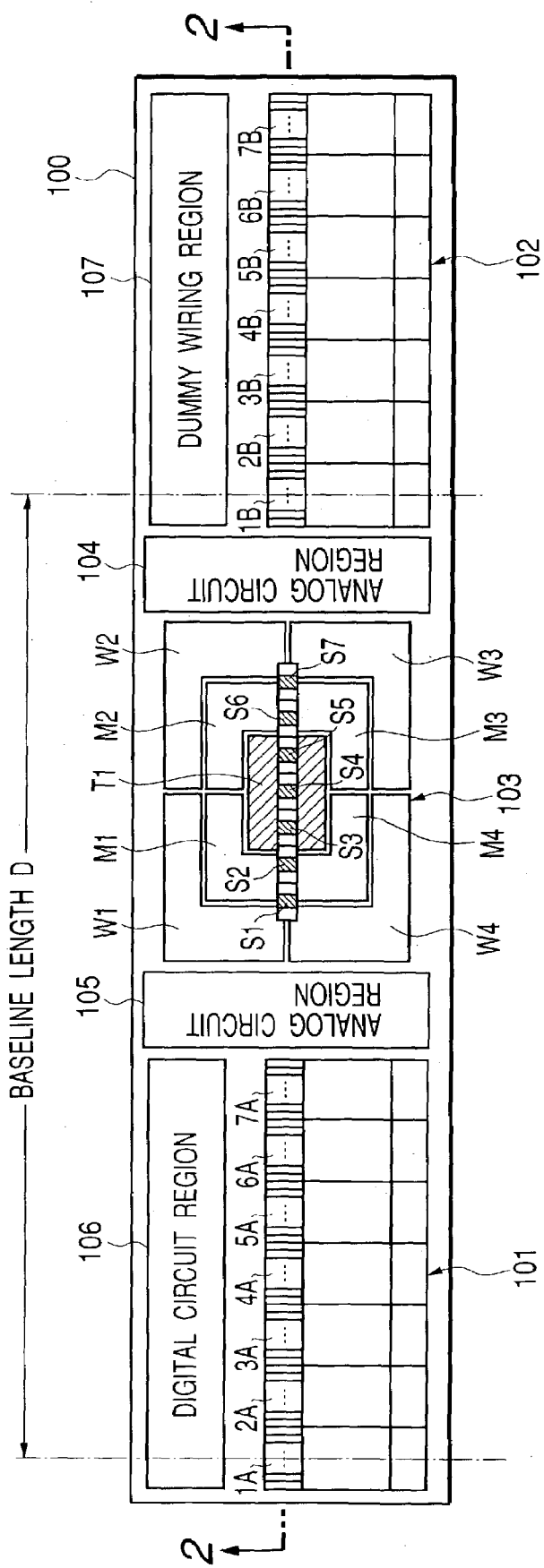
FIG. 1 is a diagram showing a plan layout of a solid state image pickup device according to a first embodiment of the invention.
Figure 2:
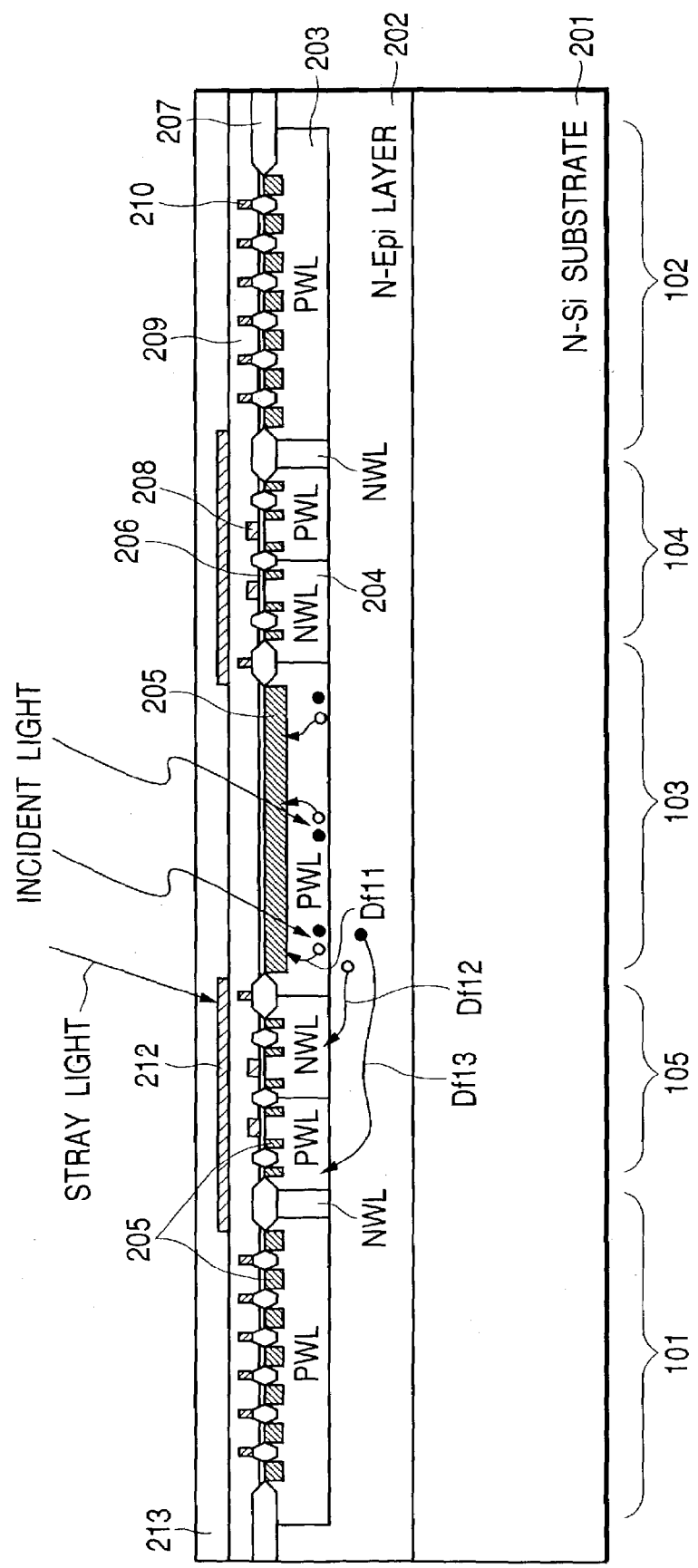
FIG. 2 is a cross sectional view of the solid state image pickup device of the first embodiment.

FIG. 1 is a diagram showing a plan layout of a solid state image pickup device according to a first embodiment of the invention. FIG. 2 is a cross sectional view of the solid state image pickup device taken along line 2—2 in FIG. 1. For the purposes of simplicity, the number of photodiodes of AF and AE sensors drawn in FIG. 1 is reduced. In the first embodiment, the solid state image pickup device is manufactured by using an n-type Si substrate and CMOS processes for a twin well structure of PWL and NWL.

In FIGS. 1 and 2, reference numeral 100 represents a Si semiconductor substrate (corresponding to an n-type Si substrate 201 shown in FIG. 2), 101 and 102 represent AF sensor regions, 103 represents an AE sensor region, 104 and 105 represent analog circuit regions, 106 represents a digital circuit region and 107 represents a dummy wiring pattern region. In FIG. 2, reference numeral 201 represents the n-type Si substrate, 202 represents an n-type epitaxial (N-Epi) layer as a first semiconductor region, 203 represents a PWL (p-type well region), 204 represents an NWL (n-type well) at the same potential as that of the n-type Epitaxial layer and 205 represents an $n^+$-type impurity doped layer. PWL 203 and $n^+$-type impurity doped layer 205 constitute a pn junction transistor in the AE sensor region 103 and AF sensor regions 101 and 102. Reference numeral 206 represents a gate oxide film, 207 represents a thick oxide film (locally oxidized silicon) as an element isolation region, 208 represents a polysilicon wiring pattern (POL) serving also as the gates of MOS transistors, 209 represents an interlayer insulating film, 210 represents an Al wiring pattern, 211 represents an interlayer insulating film, 212 represents an aluminum (Al) film as a light shielding layer and 213 represents an SiON film as a passivation film. It is preferable that the potential of the light shielding layer 212 is fixed to shield light. PWL and NWL may be formed directly in the n-type Si substrate. In this case, the first semiconductor region corresponds to the n-type Si substrate.

In this embodiment, the wells of the AF sensor regions in which AF sensor photodiodes are formed and the well of the AE sensor region in which AE sensor photodiodes are formed are electrically isolated. As shown in FIGS. 1 and 2, this electrical isolation is realized by disposing the analog circuit regions 104 and 105 between the AF sensor regions 101 and 102 in which AF sensor photodiodes are formed and the AE sensor region 103 in which AE sensor photodiodes are formed.

The analog circuit regions 104 and 105 have well regions (NWL) whose conductivity type is opposite to that of the well regions (PWL) of the AF sensor regions 101 and 102 and AE sensor region 103. This pn junction electrically isolates the AF sensor regions 101 and 102 from the AE sensor region 103.

Each region will be described in detail.

Figure 3A:
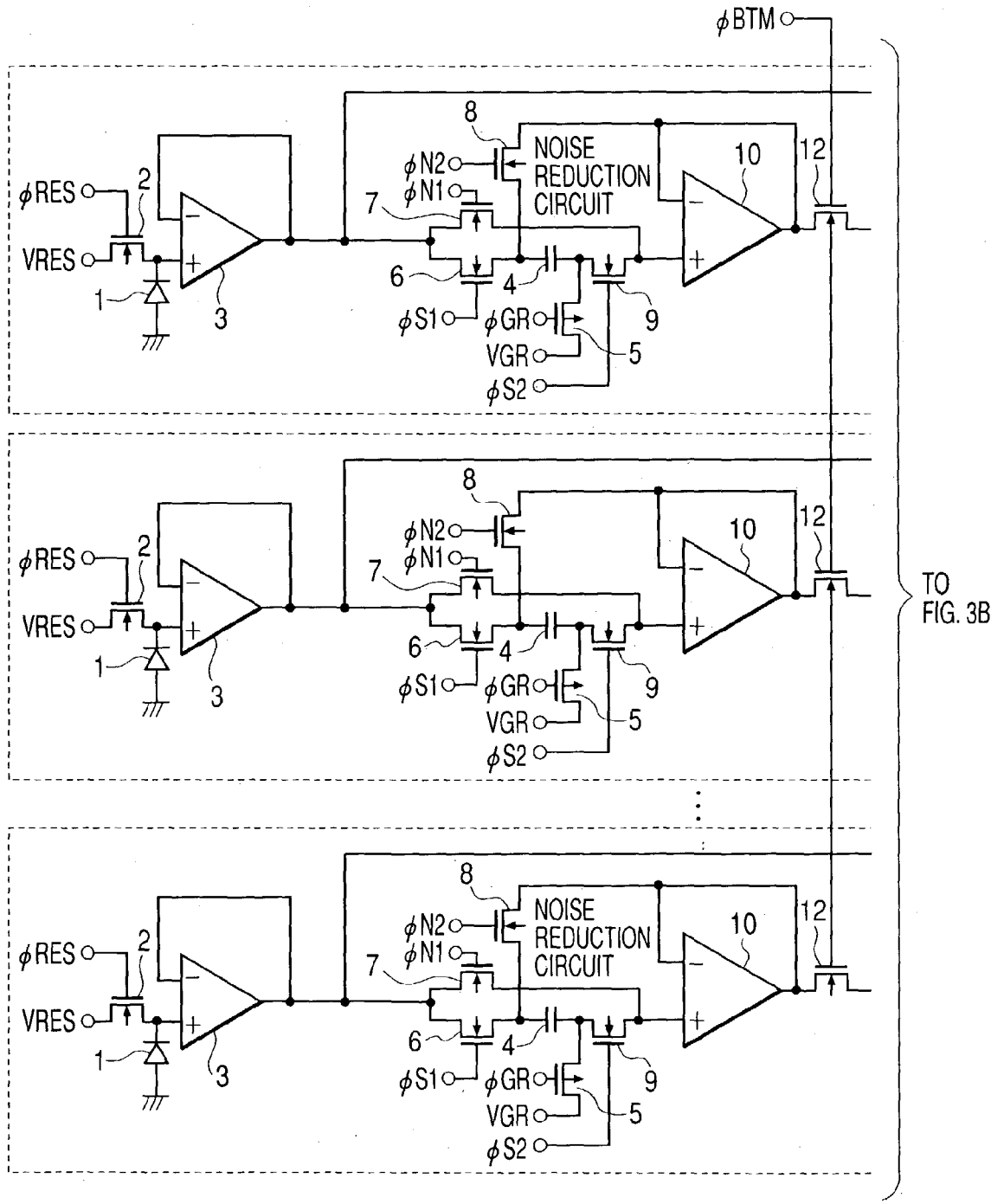
FIG. 3 is comprised of FIGS. 3A and 3B illustrating AF circuit diagrams of the solid state image pickup device of the first embodiment.
Figure 3B:
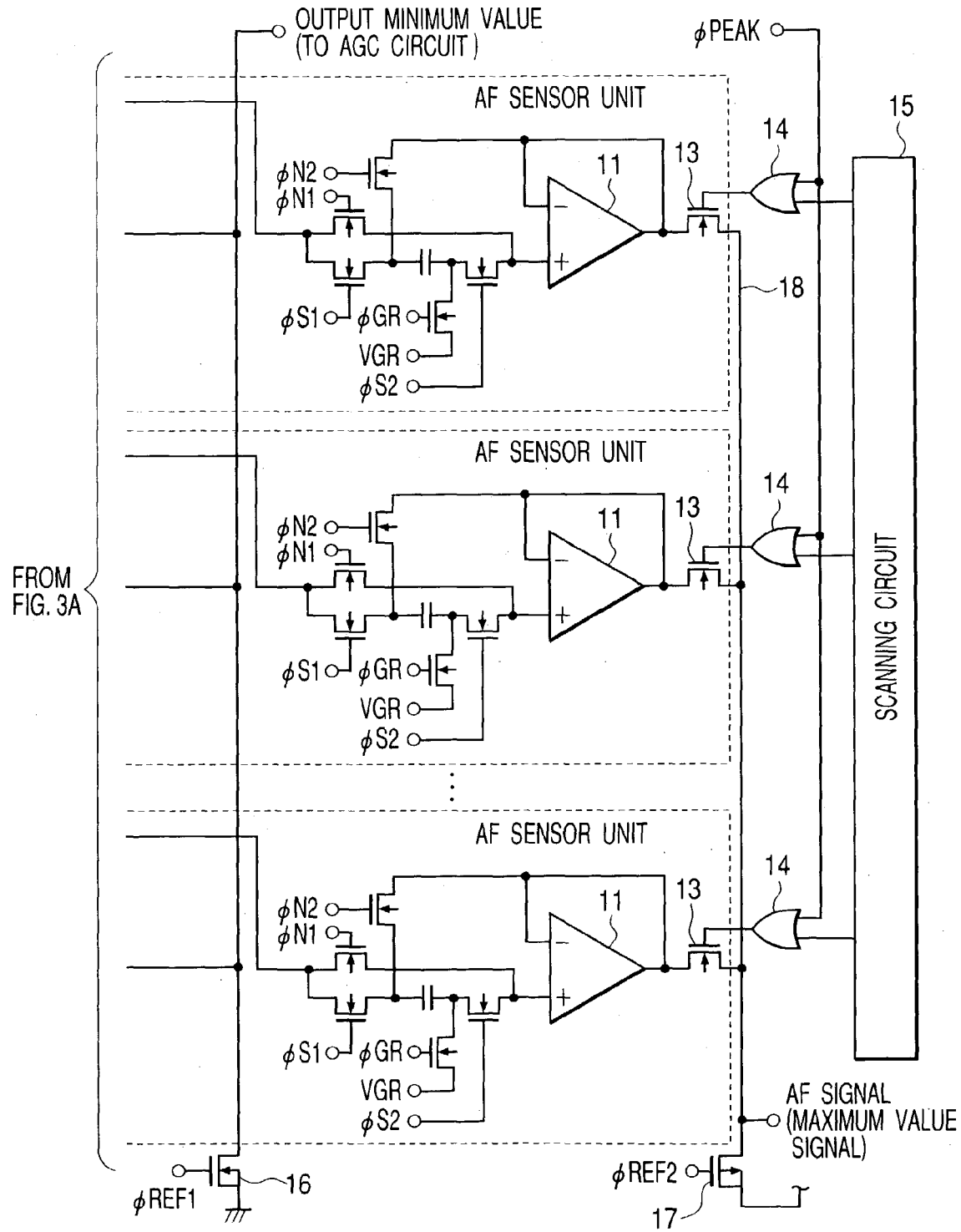

Each of the AF sensor regions 101 and 102 has seven CMOS linear AF sensor circuits (AF sensor unit) as shown in FIGS. 3A and 3B to perform seven-point AF of this embodiment. The CMOS linear AF sensor was proposed in Japanese Patent Application Laid-Open No. 2000-180706 submitted by the present applicant. Referring to FIGS. 3A and 3B, a pn junction photodiode 1 performs photoelectric conversion. A reset MOS transistor 2 resets the potential of the photodiode 1 to VRES in response to a control signal φRES. A non-inverting input terminal (+) of a differential amplifier 3 is connected to the photodiode 1 and the inverting input terminal (−) thereof is connected to its output terminal. The photodiode 1, reset MOS transistor 2 and differential amplifier 3 constitute an amplification type photoelectric conversion element. Reference numeral 4 represents a clamp capacitor, and 5 represents a MOS switch for applying a clamp potential to the clamp capacitor 4. The clamp capacitor 4 and MOS switch 5 constitute a clamp circuit. Reference numerals 6, 7, 8 and 9 represent switch MOS transistors, 10 represents a minimum value detection differential amplifier and 11 represents a maximum value detection differential amplifier. These differential amplifiers constitute a voltage follower circuit. Reference numeral 12 represents a minimum value output MOS switch, 13 represents a maximum value output MOS switch, 14 represents an OR circuit, 15 represents a scanning circuit and 16 and 17 represent constant current MOS transistors. An NMOS source follower circuit is used as the last stage of the minimum value detection circuit, whereas a PMOS source follower circuit is used as the last stage of the maximum value detection circuit. Reference numeral 18 represents a common output line to which an output signal from each pixel is applied.

In the AF sensor having the circuit described above, a feedback type noise clamp circuit is provided at the front stage of the maximum and minimum value detection circuits. Reset noises generated by the photodiode 1 and fixed pattern noises (FPN) generated by the sensor amplifier, maximum and minimum value detection circuits can be eliminated. Namely, after the photodiode 1 is reset to VRES, the MOS transistors 7 and 8 are turned on in response to control signals φN1 and φN2 so that noises of the differential amplifier 3 are input to the input side of the clamp capacitor 4 via the MOS transistor 7, minimum value detection differential amplifier 10 and MOS transistor 8. In this case, the output side of the clamp capacitor 4 is fixed to the clamp potential by turning on the MOS switch 5. Thereafter, the MOS transistors 7 and 8 are turned off and the MOS switch 5 is turned off to make the output side of the clamp capacitor 4 in the floating state. In this manner, noise components of a pixel and offset components of the minimum value detection differential amplifier 10 are held in the clamp capacitor 4. When the MOS transistors 6 and 9 are turned off in response to control signals φS1 and φS2, a sensor signal without FPN such as noise components of the pixel and offset components of the minimum value detection differential amplifier 10 is input to the minimum value detection differential amplifier 10. With similar operations, a sensor signal without FPN is input to the maximum value detection differential amplifier 11.

When a minimum value is output, the constant current source for the output stage of each voltage follower circuit of the source follower type of each pixel is turned off (by turning off the constant current MOS transistor 16) and the minimum value output MOS switches 12 are turned on at the same time in response to a control signal φBTM to connect the output terminals of the voltage follower circuits commonly to the output line to thereby obtain the minimum value of the video signal.

When a maximum value is output, the constant current source for the output stage of each voltage follower circuit is turned off (by turning off the constant current MOS transistor 17) and the maximum value output MOS switches 13 are turned on at the same time in response to a control signal φPEAK to connect the output terminals of the voltage follower circuits commonly to the output line 18 to thereby obtain the maximum value of the video signal. When a video signal is output, the constant current source for the output stage of each voltage follower circuit is turned on (by turning on the constant current MOS transistor 17) and the scanning circuit 15 sequentially turns on the maximum value output MOS switch 13 to connect the output terminal of each voltage follower circuit to the output line to thereby obtain serial video signals. In these operations, the same circuit can be used for the maximum value detection circuit and signal output circuit so that the chip can be made compact.

The photodiode region of the AE sensor region 103 is divided into sixteen regions in order to realize optimum photometry for each of zoom areas (telephoto, standard, wide angle) of the taking lens. In order to enable to detect stray light, seven spot AE photodiodes S1, S2, S3, S4, S5, S6 and S7 are provided.

Figure 4:
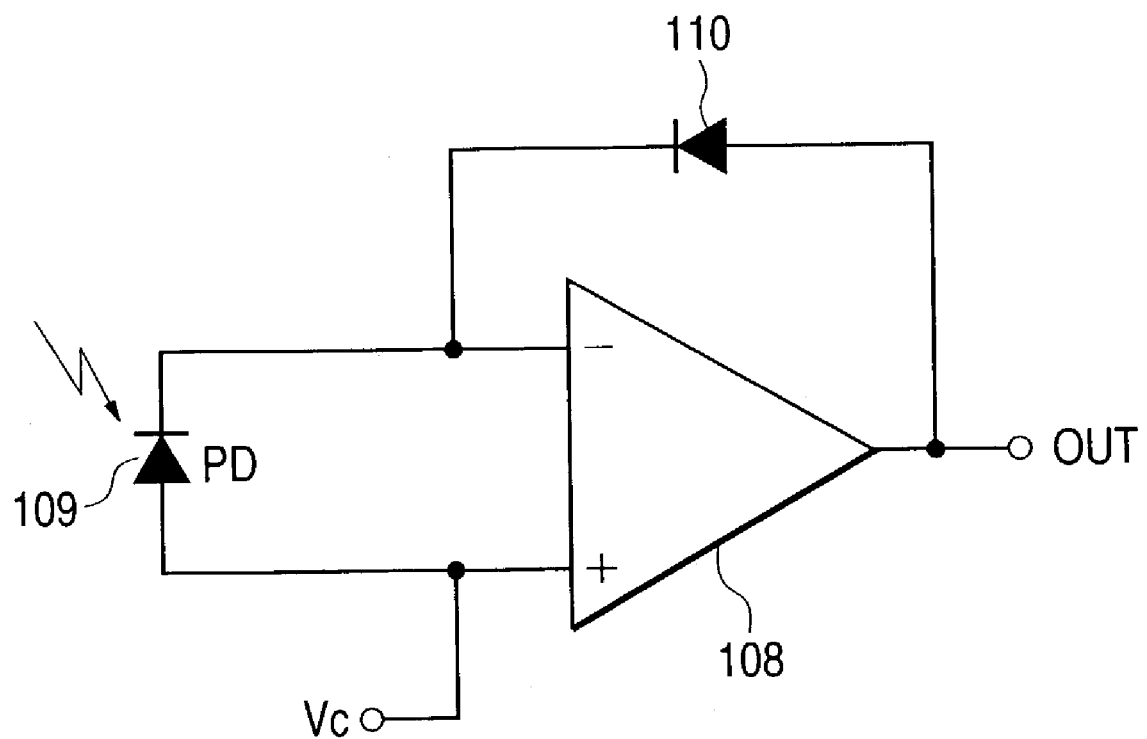
FIG. 4 is an AE circuit diagram of the solid state image pickup device of the first embodiment.

FIG. 4 is a circuit diagram of an AE circuit of a logarithmically compressed photoelectric current output type of the embodiment. In FIG. 4, reference numeral 108 represents a CMOS differential amplifier, 109 and 110 represent pn junction photodiodes. Since the potential at both the terminals of the pn junction photodiode is set to a reference potential Vc, the pn junction photodiode is in a zero bias state. The depletion layer can therefore be prevented from being broadened and dark current in the depletion layer can be suppressed.

The reference potential Vc is set to a potential of about 1.2 V generated by a reference potential generator circuit (band gap generator circuit or the like) to be described later. This setting is made because it is necessary to use a potential higher than the ground potential in order to utilize a good linear characteristic region of the CMOS differential amplifier 108. If a depletion type MOS is used for the CMOS differential amplifier 108, it is not necessary to set the reference potential to such a potential. However, since the process cost rises, it is unpractical.

From these reasons, it is necessary to set the well potential of an AE photodiode higher than the well potential (ground potential) of an AF photodiode of a reversely biased storage type. This is impossible for the conventional same well structure. This invention is also very effective in view of this.

Photoelectric current generated by the photodiode 109 flows through the pn junction photodiode 110 and is converted into voltage. The logarithmically converted output is obtained by the current-voltage characteristics of the photodiode 110 as:

$$Vout = Vc + (kT/q) \cdot ln(Ip/Is)$$

where k is the Boltzmann's constant, T is an absolute temperature, q is an elementary charge, Ip is a photoelectric current and Is is a diode reverse saturation current. It can be understood from this equation that if there is a variation in diode reverse saturation currents Is, there is a variation in AE characteristics. In order to reduce the variation, an Is correction circuit is used.

Figure 5A:
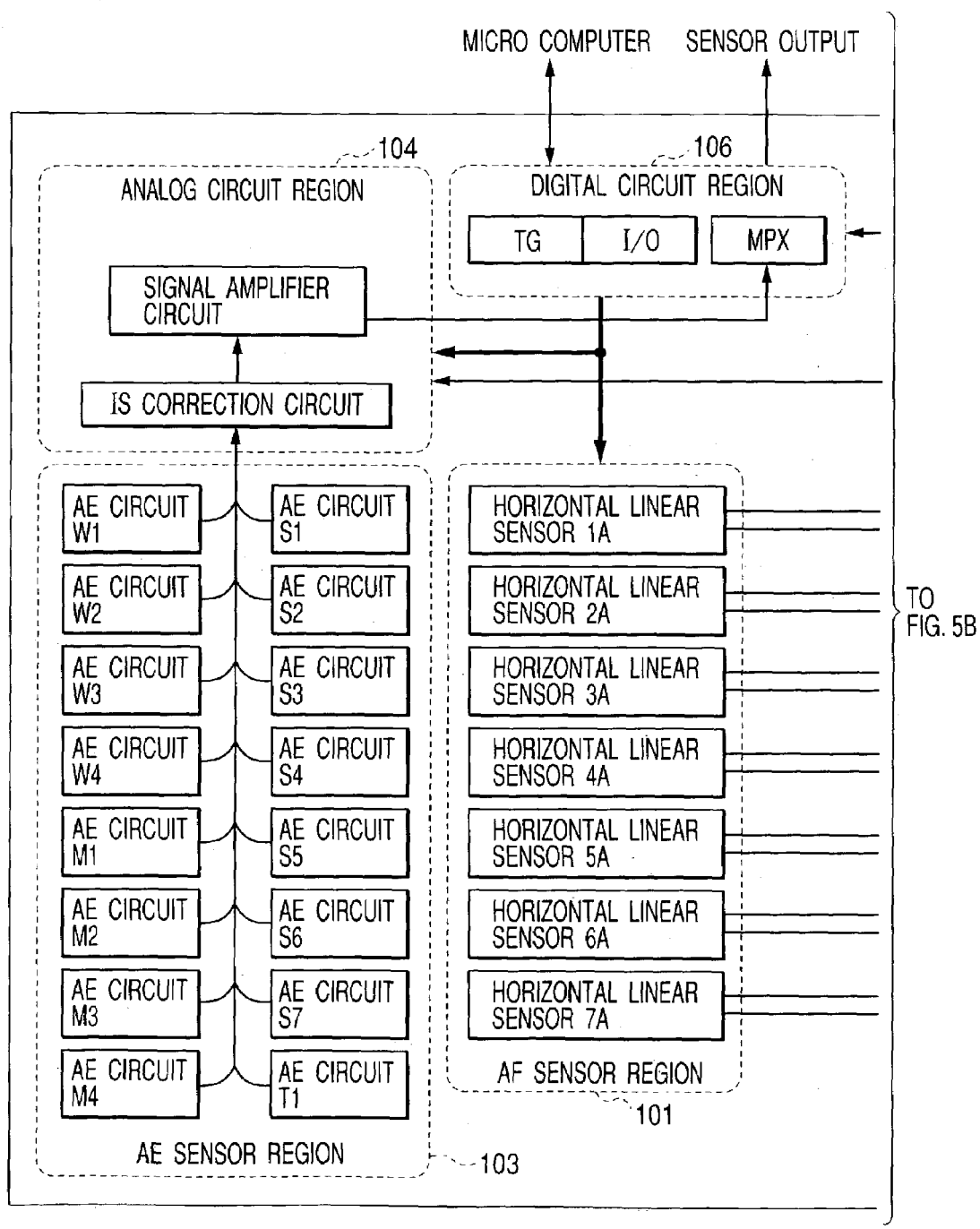
FIG. 5 is comprised of FIGS. 5A and 5B illustrating circuit diagrams showing all circuits of the solid state image pickup device of the first embodiment.
Figure 5B:
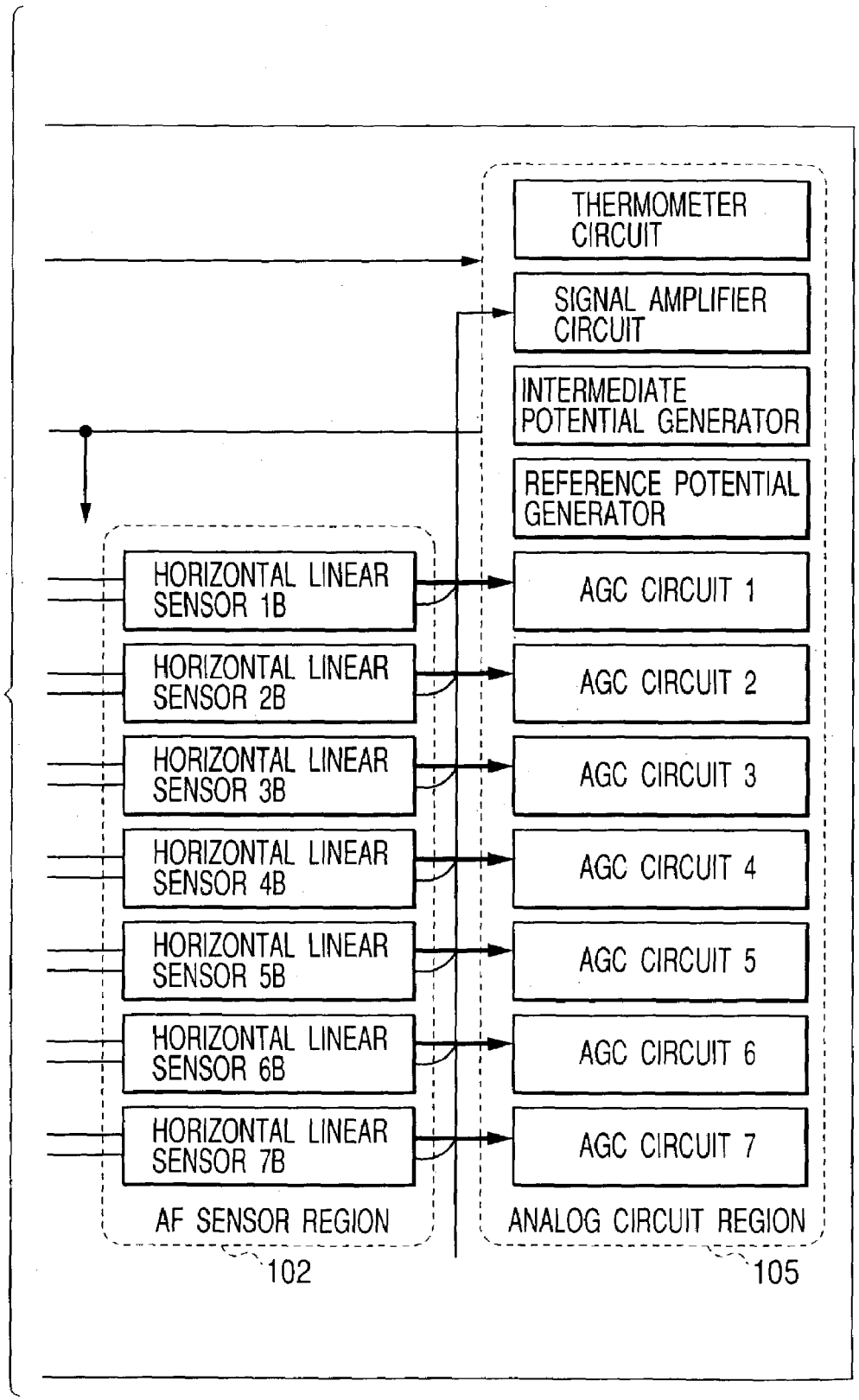

FIGS. 5A and 5B are circuit diagrams showing all circuits of the solid state image pickup device of the embodiment. The AF sensor regions 101 and 102 and AF sensor region 103 have been described earlier. The AF sensor region 101 is constituted of horizontal linear sensors 1A, 2A, 3A, 4A, 5A, 6A and 7A and the AF sensor region 102 is constituted of horizontal linear sensors 1B, 2B, 3B, 4B, 5B, 6B and 7B. The AE sensor region 103 is constituted of AE circuits W1, W2, W3 and W4, M1, M2, M3 and M4 and S1, S2, S3, S4, S5, S6 and S7.

The analog circuit region 104 has a circuit for processing signals supplied from the AE sensor region 103, which circuit includes the Is correction circuit and a signal amplifier circuit. The analog circuit region 105 has: an auto gain control circuit (AGC) for controlling an accumulation time of the AF sensor regions 101 and 102; the reference potential generator circuit (band gap generator circuit) for generating the reference potential; an intermediate potential generator circuit (power source circuit) for generating intermediate potentials such as VRES and VGR necessary for the AF sensor circuit; the signal amplifier circuit for amplifying a signal and outputting it to an external; and a thermometer circuit for monitoring a substrate temperature.

The digital circuit region 106 has a timing generator circuit (TG) to be used for driving the sensor circuit, an I/O circuit for communication with an external computer, and a multiplexer (MPX) for selecting each signal and outputting it to an external.

The dummy wiring region 107 not shown in FIGS. 5A and 5B has an inverter element group, a NAND element group and an OR element group to be used in the digital circuit region 106, these groups being disposed in a disabled state (gates are set to a fixed voltage).

Next, the crosstalk reduction effects of the embodiment will be described with reference to FIG. 2. Photoelectric charges generated in the wells (PWL) of photodiodes in the AF sensor regions 101 and 102 and AE sensor region 103 are confined in the wells by an electric field so that crosstalks with photodiodes in other sensor regions are not generated. Namely, electrons (indicated by white circles in FIG. 2) generated by incident light are absorbed in the $n^+$-type impurity doped layer 205 in the AE and AF sensor regions in a floating state as indicated by Df11 in FIG. 2. Of pairs of electrons and holes generated in the substrate, electrons (indicated by white circles in FIG. 2) generated in the substrate are absorbed by the power source via the substrate or NWL adjacent to photodiodes as indicated by Df12 in FIG. 2, whereas holes (indicated black circles in FIG. 2) are absorbed by the ground potential (GND) via PWL as indicated by Df13 in FIG. 2. Crosstalks between the AF and AE photodiodes are not generated fundamentally.

Stray light indicated by a straight arrow can be prevented from entering adjacent photodiodes by the light shielding layer 212. Therefore, crosstalks by stray light are not generated fundamentally. However, since leak light to be caused by irregular reflection on the light shielding layer 212 may be generated, it is preferable to make the light shielding film by using a composite film of TiN/Ti/Al having a lower reflectivity. Electric crosstalks are hard to be generated because signal wiring lines in the AE and AF sensor regions are electrically shielded by wiring lines of the analog circuit. By disposing the AF sensor regions spaced apart from the AE sensor region, it becomes possible to considerably reduce crosstalks by stray light, crosstalks by photoelectric carriers generated in the substrate, and crosstalks by parasitic capacitance between wiring lines. Since the separation region can be used as other circuit regions, the chip size can be reduced.

The planarization precision which is the second aspect of the embodiment will be described. The dummy wiring region is disposed in order to make the region without wiring layers other than the photodiode regions have a size of 200 μm square or smaller (a distance between wiring layers is set to 200 μm or shorter). With this arrangement, the CMP planarization precision can be improved greatly. The irregular sensitivity can therefore be suppressed. As in the embodiment, it is preferable that the optical center of the AE sensor region is coincident with that of the AF sensor regions.

In this embodiment, the AE and AF sensor regions are made of only CMOS circuits. On-chip of various analog and digital CMOS circuits is therefore facilitated and various intelligent peripheral circuits can be realized at the same time.

The embodiment provides compact AE and AF solid state image pickup devices with reduced crosstalks and irregular sensitivities. The invention is not limited only to CMOS sensors, but it is also applicable to charge coupled devices (CCD), base-stored image sensors (BASIS), static induction transistors (SIT), charge modulation devices (CMD), amplified MIS imagers (AMI) and the like.

(Second Embodiment)

FIG. 6 is a diagram showing a plan layout of a solid state image pickup device according to a second embodiment of the invention, and FIG. 7 is a cross sectional view of the solid state image pickup device of the second embodiment. In FIGS. 6 and 7, reference symbol 100a represents an Si semiconductor substrate, 214a and 214b represent $n^+$-type diffusion regions, and 212a and 212b represent light shielding layers. Reference numeral 215 represents an AF sensor circuit in the AF sensor region 101. In this embodiment, high impurity concentration regions (n-type element isolation regions) 214a and 214b of the same conductivity type as that of the substrate are disposed between the AF sensor regions 101 and 102 and the AE sensor region 103 in order to further reduce crosstalks between the AE and AF sensor regions. The crosstalk reduction effects of the second embodiment are better than those of the first embodiment. However, analog circuits are required to be formed in other areas so that the chip area is increased. This embodiment is effective when crosstalk reduction is desired more than chip area reduction.

(Third Embodiment)

FIG. 8 is a diagram showing a plan layout of a solid state image pickup device according to a third embodiment of the invention. In FIG. 8, reference numeral 215 represents an $n^+$-type buried layer. This embodiment is characterized in that the wells of the AE sensor region 103 and AF sensor regions 101 and 102 are perfectly separated by the $n^+$-type high impurity concentration layer 214 and $n^+$-type buried layer 215. Although the burying process is necessary, this embodiment is effective for reducing crosstalks by all means.

Figure 9:
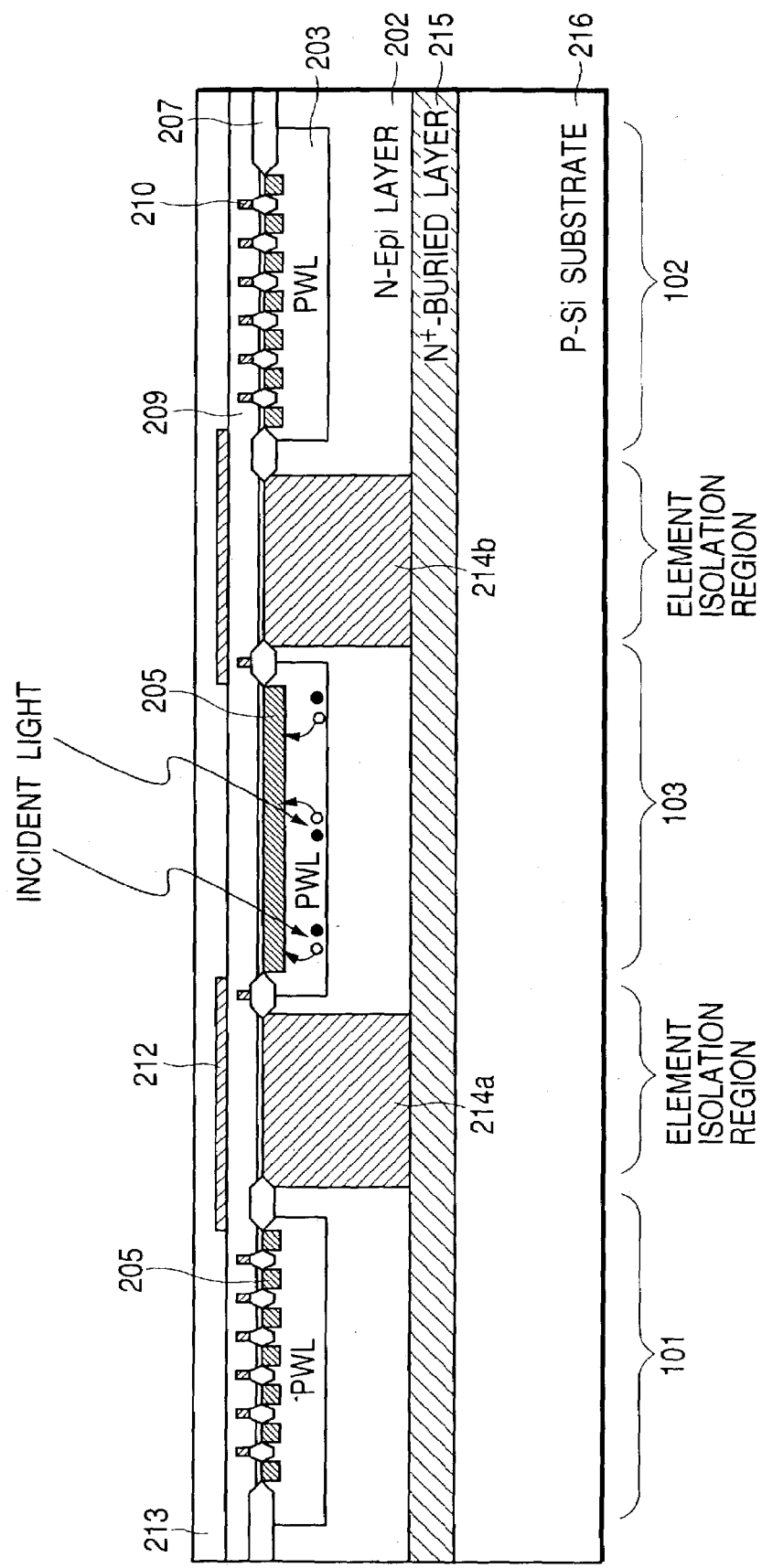
FIG. 9 is a cross sectional view of a solid state image pickup device according to a modification of the third embodiment.

As shown in FIG. 9, instead of an n-type Si substrate, a p-type substrate may also be used with similar expected effects.

(Fourth Embodiment)

Figure 10:
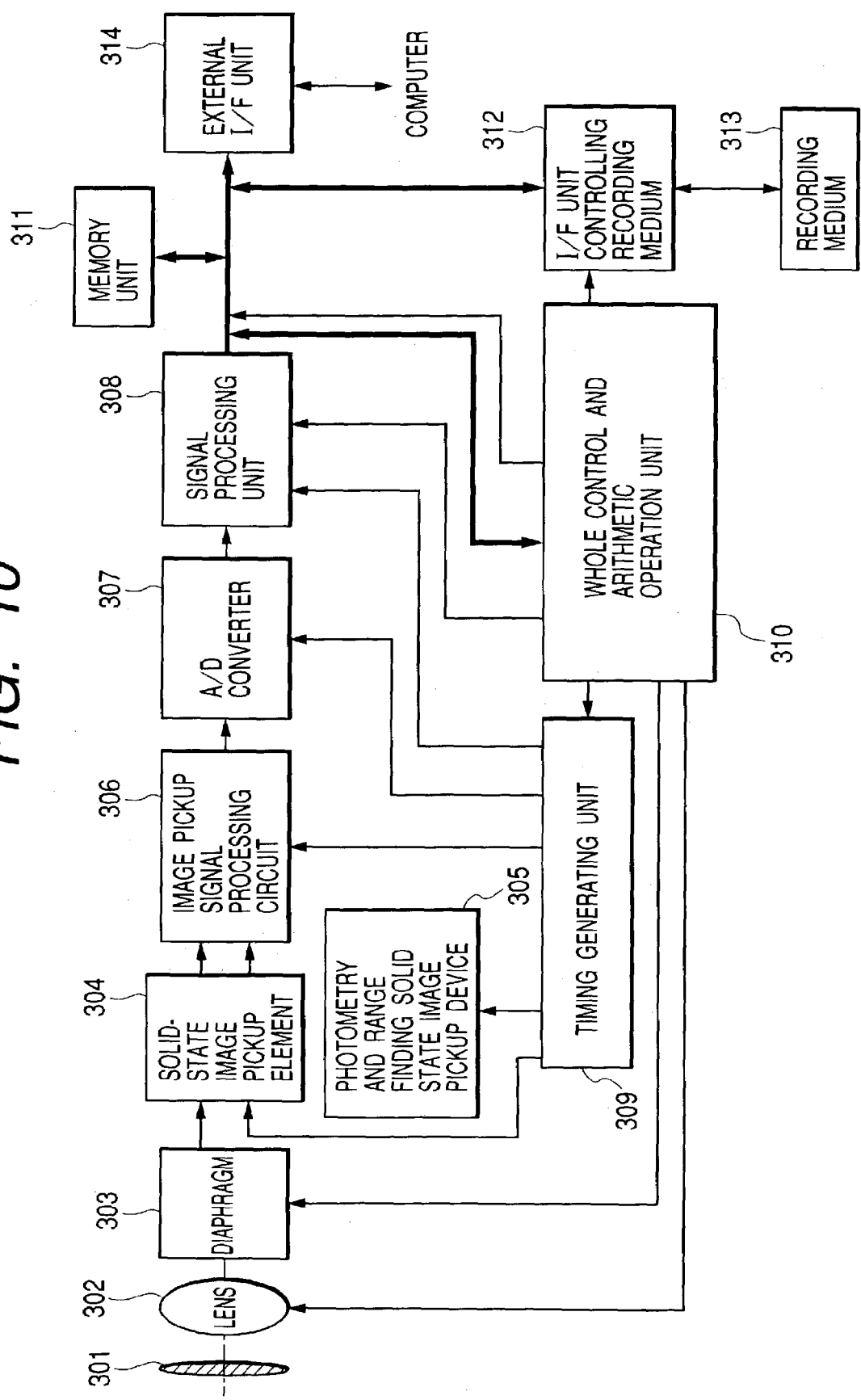
FIG. 10 is a block diagram showing a camera using a solid state image pickup device according to a fourth embodiment.
Figure 11:
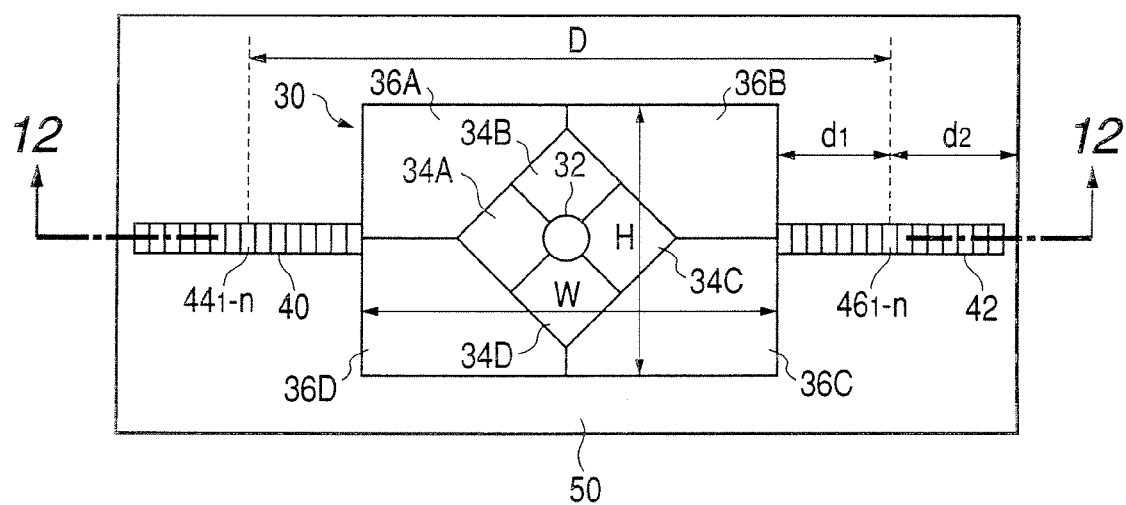
FIG. 11 is a diagram showing a plan layout of a conventional solid state image pickup device.
Figure 12:
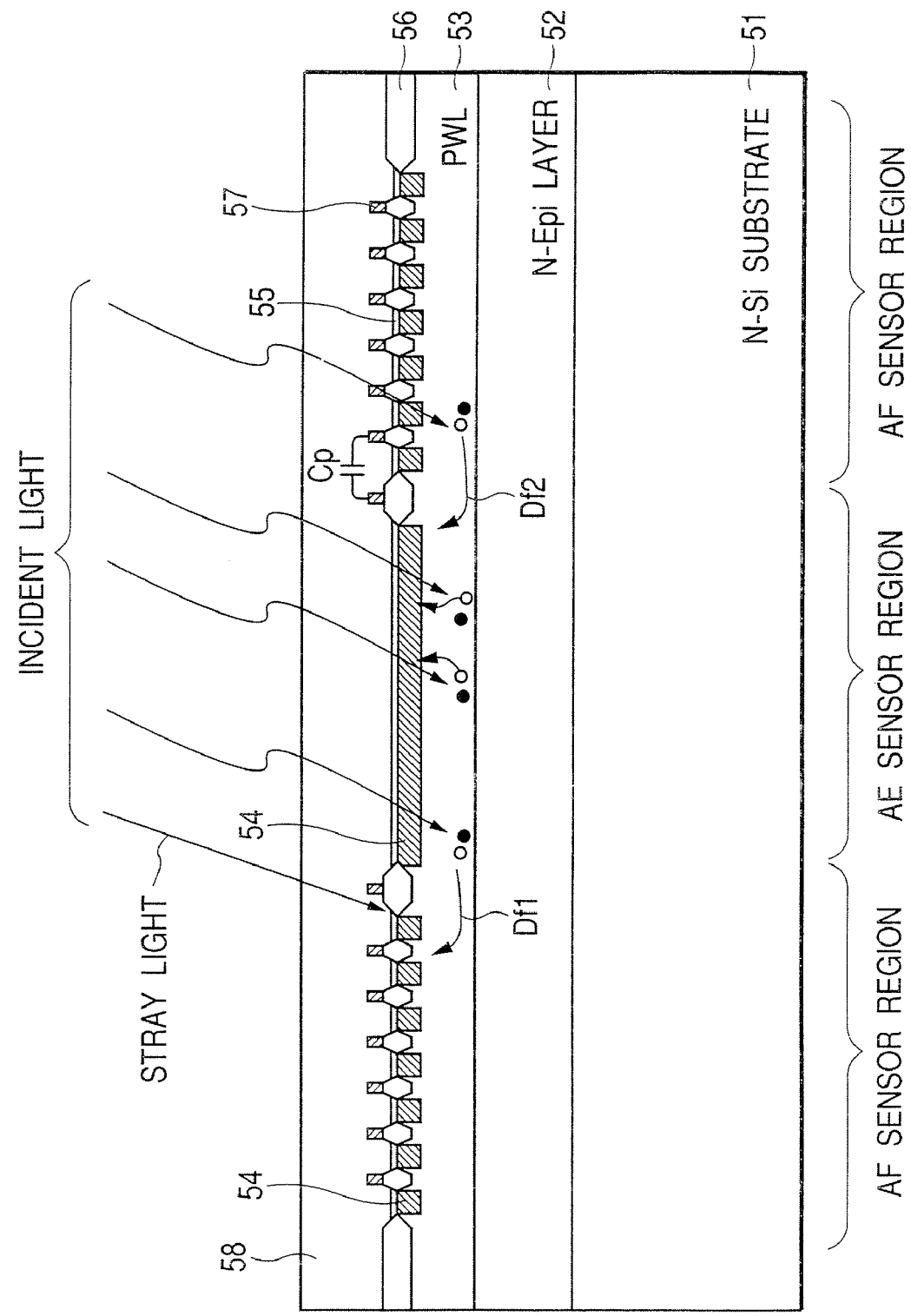
FIG. 12 is a cross sectional view of the conventional solid state image pickup device taken along line 12—12 in FIG. 11.

Next, a camera using in photometry and range finding the solid state image pickup device according to any one of the above described embodiments is described as follow. FIG. 10 is a block diagram showing one embodiment of lens shutter digital compact camera using in photometry and range finding the solid state image pickup device of any one of the above described embodiments. Referring to FIG. 10, 301 denotes a barrier protecting lens and also operating as a main switch. 302 denotes a lens focusing an optical image of an object onto a solid state image pickup device 304. 303 denotes a diaphragm varying a light quantity passing through the lens 302. 304 denotes the solid state image pickup device picking up as an image signal the optical image of the object, focused by the lens 302.

305 denotes a solid state image pickup device according to any one of the above described embodiments used in the photometry and range finding herein. For example, the image pickup device shown in FIG. 1, FIG. 7 or FIG. 8 may be used. 306 denotes A/D connecter for analog to digital connecting an image signal a photometry signal and a range finding signal outputted from the solid state image pickup device 304 and the solid state image pickup device 305 for finding. 308 denotes a signal processing unit for connecting in several kinds of manners and for compressing an image data outputted from the A/D converter 307. 309 denotes a timing generator outputting several kinds of timing signals to the solid state image pickup device 304, the image pickup signal processing circuit 306, the A/D converter 307, the signal processing unit 308 and et cetera. 301 denotes whole controlling and arithmetic operating unit conducting arithmetic operation and controlling whole of the camera. 311 denotes a memory unit storing temporally the image data.

While, 312 denotes an interface unit for recording in and reading from the recording medium. 312 denotes a detachable recording medium such as a semiconductor memory for recording therein and reading therefrom the image data. 314 denotes an interface unit for communicating with an external computer or the like.

Next, a taking operation of the lens shutter digital compact camera is described as follow. As the barrier opens, a main switch is turned on. Then, a power source for control system is turned on. Further, a taking system circuit such as the A/D converter 307 and et cetera are enabled. Next, in order to control an exposure, the whole controlling and arithmetic operation unit 310 sets the diaphragm 303 at full open. A signal outputted from AE sensor of the photometry and range finding solid state image pickup device 305 is converted by the A/D converter 307, and then inputted into the signal processing unit 308. And, based on a data outputted from the signal processing unit 308, an exposure quantity is calculated by the whole controlling and arithmetic operation unit 310.

The whole control and arithmetic operation unit 310 determinates a luminosity based on the photometry result, and base on the determination, control the diaphragm 303. And, based on a signal outputted from AF sensor of the photometry and range finding solid state image pickup device 305, the whole control and arithmetic operation unit 310 calculates a distance from the object according to the phase detecting described in the above. And, then, the unit 310 drives lens 320 and determine being in or out of focus, when it is out of focus, the lens 302 is driver again and calculate distance to automatically focusing.

Next, after recognizing being in focus, a practical exposure starts. As the exposure is completed, the image signal outputted from the solid state image pickup device 304 is A/D converted by the A/D converter 307, passes through the signal processing unit 308, and written in the memory unit 311 by the whole control and arithmetic operation unit 310. Thereafter, the data stored in the memory unit 311 passes through a recording medium control I/F unit 312 and recorded in a detachable recording medium 313 under a control of the whole control and arithmetic operation unit 310. And it may pass through an external I/F unit 314 and may be and inputted directly into a computer or the like. It is to be noted that the photometry and range detecting solid state image pickup device in the present embodiment may be used not only in the digital compact camera but also in another type of camera using a silver salt film.

As described so far, according to the present invention, a solid state image pickup device having photometry and range finding functions of high performance can be realized by one chip. For example, compactness, high performance and low cost of a lens shutter compact camera using the solid state image pickup device can be realized. Similar effects can be expected not only for compact analog (silver salt) cameras, but also for compact digital cameras.

What is claimed is:

1. An AE/AF sensor device comprising:
a first semiconductor region of a first conductivity type;
a second semiconductor region of a second conductivity type opposite to the first conductivity type, said second semiconductor region being disposed in said first semiconductor region;
a third semiconductor region of the second conductivity type formed in said first semiconductor region, said third semiconductor region being electrically isolated from said second semiconductor region;
a fourth semiconductor region of the first conductivity type formed in said second semiconductor region; and
a fifth semiconductor region of the first conductivity type formed in said third semiconductor region,
wherein one photoelectric conversion element is formed by using said second and fourth semiconductor regions, and another photoelectric conversion element is formed by using said third and fifth semiconductor regions,
wherein said one photoelectric conversion element is a photometry photoelectric conversion element, and said another photoelectric conversion element is an automatic focusing photoelectric conversion element, and
wherein a dummy wiring region is disposed in a region other than the region where the photometry photoelectric conversion element and the automatic focusing photoelectric conversion element are formed so that a distance between wiring layers is set to 200 μm or shorter.

2. An AE/AF sensor device comprising:
a first semiconductor region of a first conductivity type;
a second semiconductor region of a second conductivity type opposite to the first conductivity type, said second semiconductor region being disposed in said first semiconductor region;
a third semiconductor region of the second conductivity type formed in said first semiconductor region, said third semiconductor region being electrically isolated from said second semiconductor region;
a fourth semiconductor region of the first conductivity type formed in said second semiconductor region; and
a fifth semiconductor region of the first conductivity type formed in said third semiconductor region,
wherein one photoelectric conversion element is formed by using said second and fourth semiconductor regions, and another photoelectric conversion element is formed by using said third and fifth semiconductor regions,
wherein said one photoelectric conversion element is a photometry photoelectric conversion element, and said another photoelectric conversion element is an automatic focusing photoelectric conversion element,
wherein an output of the automatic focusing photoelectric conversion element is used as an autofocus signal of a phase difference detection type and a photoelectric current output of the photometry photoelectric conversion element is logarithmically compressed and used as a photometry signal,
wherein a potential of said second semiconductor region is higher than a potential of said third semiconductor region.

3. A camera comprising an AE/AF sensor device according to claim 1, a detecting region for detecting an image of an object, a lens for focusing light onto said detection region, and a signal processing circuit for controlling the automatic focusing and a photometry based on a signal from said AE/AF sensor device.

4. A camera comprising an AE/AF sensor device according to claim 2, a detecting region for detecting an image of an object, a lens for focusing light onto said detection region, and a signal processing circuit for controlling the automatic focusing and a photometry based on a signal from said AE/AF sensor device.

* * * * *

UNITED STATES PATENT AND TRADEMARK OFFICE
CERTIFICATE OF CORRECTION

PATENT NO. : 7,164,447 B2
APPLICATION NO. : 10/361598
DATED : January 16, 2007
INVENTOR(S) : Hidekazu Takahashi It is certified that error appears in the above-identified patent and that said Letters Patent is hereby corrected as shown below:

<u>COLUMN 4</u>:
Line 14, "Epitaxial" should read --epitaxial--.

<u>COLUMN 8</u>:
Line 59, "A/D connecter" should read --an A/D connector--.

<u>COLUMN 9</u>:
Line 28, "base" should read --based--; and "control" should read --controls--.
Line 34, "determine" should read --determines--.
Line 35, "when" should read --and when--; and "driver" should read --driven--.
Line 36, "calculate" should read --calculates--.

Signed and Sealed this

Twenty-fourth Day of July, 2007

JON W. DUDAS
*Director of the United States Patent and Trademark Office*